US007646428B2

(12) United States Patent
Takayama

(10) Patent No.: US 7,646,428 B2
(45) Date of Patent: Jan. 12, 2010

(54) PACKAGE FOR SOLID IMAGE PICKUP ELEMENT AND SOLID IMAGE PICKUP DEVICE

(75) Inventor: Yoshiki Takayama, Shiga (JP)

(73) Assignee: Panasonic Corporation, Osaka (JP)

( * ) Notice: Subject to any disclaimer, the term of this patent is extended or adjusted under 35 U.S.C. 154(b) by 421 days.

(21) Appl. No.: 11/523,588

(22) Filed: Sep. 20, 2006

(65) Prior Publication Data

US 2007/0146532 A1 Jun. 28, 2007

(30) Foreign Application Priority Data

Dec. 22, 2005 (JP) ............................. 2005-368915

(51) Int. Cl.
*H04N 5/225* (2006.01)
*H04N 5/335* (2006.01)
*H01L 23/06* (2006.01)

(52) U.S. Cl. ....................... 348/374; 348/294; 348/340; 257/684

(58) Field of Classification Search ................. 348/272, 348/294, 374, 340; 257/444, 433, 432, 434, 257/680, 704
See application file for complete search history.

(56) References Cited

U.S. PATENT DOCUMENTS 6,144,107 A * 11/2000 Narita ......................... 257/789
7,378,724 B2 * 5/2008 Yu et al. ...................... 257/685
2002/0096730 A1 * 7/2002 Tu et al. ...................... 257/433
2003/0116817 A1 * 6/2003 Yeh et al. ..................... 257/444
2005/0174469 A1 * 8/2005 Cho et al. .................... 348/340

FOREIGN PATENT DOCUMENTS

JP        06053459        2/1994

* cited by examiner

*Primary Examiner*—Nhan T Tran
*Assistant Examiner*—Quang V Le
(74) *Attorney, Agent, or Firm*—Steptoe & Johnson LLP

(57) ABSTRACT

In a package including a base fixed with a solid image pickup element, a side wall rising up along the periphery of the base, and internal terminals arranged on a step of the side wall, a plurality of recesses are formed at certain intervals in a lower part of the step to prevent bleeding of an adhesive fixing the solid image pickup element from creeping up over the internal terminals. When the adhesive and bleeding thereof spread around the solid image pickup element during die bonding, they flow into the recesses, making even fast-flowing bleeding hardly creep up an inner surface of the side wall including the step, and enabling prevention of the adhesive from adhering to the internal terminal. Strength, questioned by the presence of the recesses upon wire bonding, can be secured by residual parts between the recesses, and defective wire bonding is less likely to occur.

8 Claims, 5 Drawing Sheets

PACKAGE FOR SOLID IMAGE PICKUP ELEMENT AND SOLID IMAGE PICKUP DEVICE

FIELD OF THE INVENTION

The present invention relates to a package for a solid image pickup element and solid image pickup device used for a digital still camera, digital video camera, cellular phone with a built-in camera or the like.

BACKGROUND OF THE INVENTION

There is a growing demand for a digital still camera, digital video camera (movie) or cellular phone with a built-in camera meeting not only high-pixel, high image quality but also downsizing requirements, and a solid image pickup device mounted on such an apparatus is becoming more compact in recent years.

FIG. 10 shows a conventional solid image pickup device. A solid image pickup element 51 is fixed to a base 11 of a concave package 100 using an adhesive 52, terminals of the solid image pickup element 51 are electrically connected to internal terminals 31 arranged on a step 13 of a side wall 12 of the package 100 using bonding wires 53, and a transparent member such as cover glass 54 to keep the interior of the package 100 airtight is adhered to the top face of the package 100.

Downsizing this solid image pickup device requires reduction to a minimum of a clearance between an inner surface 12a of the side wall 12 of the package 100 and the side of the solid image pickup element 51. However, with such setting, the distance between the solid image pickup element 51 and internal terminals 31 is shortened and if the adhesive 52 is extruded around when the solid image pickup element 51 is die-bonded to the base 11, the adhesive 52 would creep up over the internal terminals 31 and the terminals of the solid image pickup element 51, causing problems of short-circuit or the like.

As a measure for this problem, there has been proposed a method of optimizing a nozzle layout for applying the adhesive 52 and the amount of the adhesive applied, thereby minimizing the amount of the adhesive 52 extruded. However, though this method has an effect on suppressing the extrusion of the adhesive 52, bleeding of a solvent component generated from the adhesive 52 spreads faster than the adhesive 52, resulting in a situation that can hardly be handled.

As shown in FIG. 11, there is another proposal for a package 101 having a layered structure comprising ceramic boards 200A to 200D with the ceramic board 200C interposed between the ceramic board 200B which supports internal terminals 31 on the top face thereof and the ceramic board 200D which serves as a base 11, the ceramic board 200C having a smaller width than that of the ceramic board 200B such that a gap 201 is formed to collect therein an adhesive 52 extruded (see Japanese Patent Laid-Open No. 6-53459). However, this method has a possibility of resulting in insufficient strengths of the protruding part of the ceramic board 200B and the internal terminals 31 thereon, threatening to cause deformation or damage due to load at the time of wire bonding, which may lead to defective wire bonding.

DISCLOSURE OF THE INVENTION

The present invention is intended to solve the above described problems and it is an object of the present invention to provide a small-size package for a solid image pickup element and solid image pickup device which prevents an adhesive or bleeding generated therefrom from adhering to internal terminals during die-bonding, reduces the rate of occurrence of deformation or damage of the internal terminals due to load during wire-bonding and reduces the possibility of defective wire bonding.

In order to achieve the above described object, the package for a solid image pickup element of the present invention is a package for a solid image pickup element including a base fixed with a solid image pickup element, a side wall rising up along the periphery of the base to form a recessed space for housing the solid image pickup element, and internal terminals arranged on a step in an inner periphery of the side wall to lead out terminals of the solid image pickup element, wherein a plurality of recesses are formed at certain intervals in a lower part of the step to prevent bleeding from an adhesive fixing the solid image pickup element from creeping up over the internal terminals.

The solid image pickup device of the present invention is such that the above described package for a solid image pickup element is fixed with a solid image pickup element and wire-bonded.

It is preferable that recesses connected to the recesses of the step are formed in the base. This is because in this way, the volume for accommodating the adhesive and bleeding thereof increases, making it possible to more reliably prevent the adhesive from creeping up over the internal terminals.

Surface roughness of a bottom face of the recess is preferably greater than surface roughness of the other surface. This is because in this way the progress rate of bleeding toward the recess increases.

The base and side wall may be formed by laminating ceramic boards or made of resin.

DESCRIPTION OF THE EMBODIMENTS

Embodiments of the present invention will be explained with reference to the attached drawings below.

Figure 1:
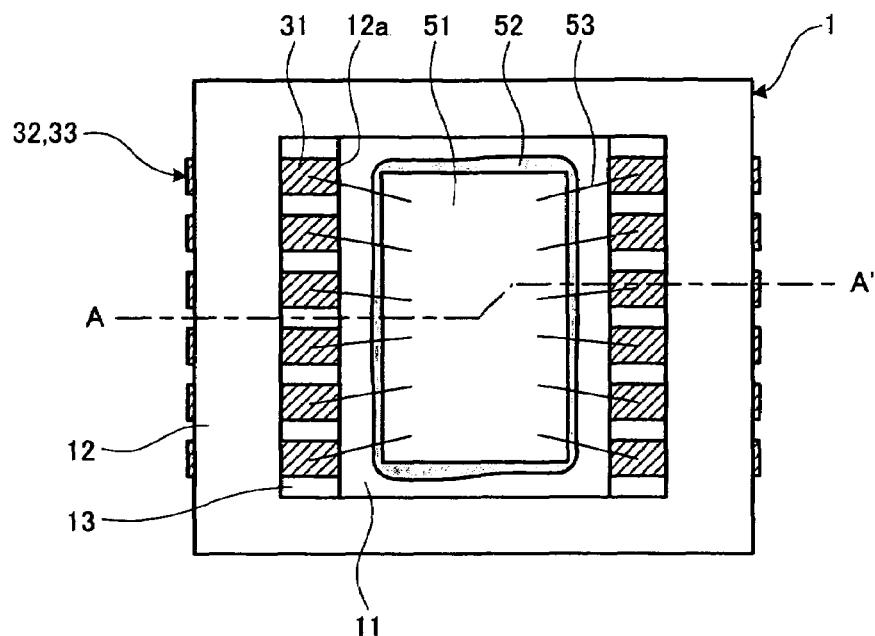
FIG. 1 is a plan view of a solid image pickup device using a package for a solid image pickup element according to Embodiment 1 of the present invention.
Figure 2:
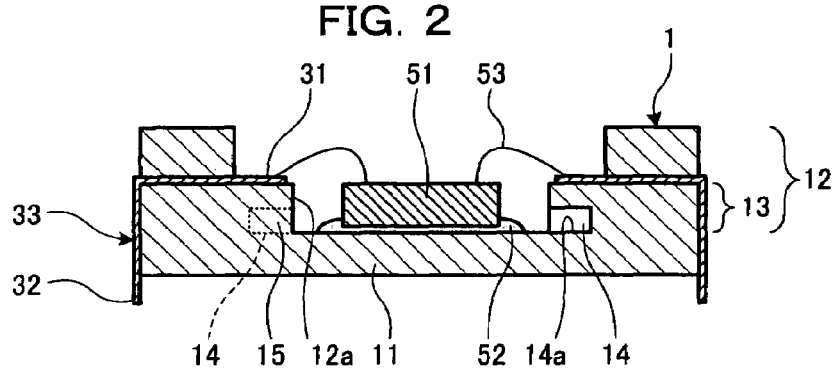
FIG. 2 is a cross-sectional view taken along a line A-A' of the solid image pickup device in FIG. 1.
Figure 3:
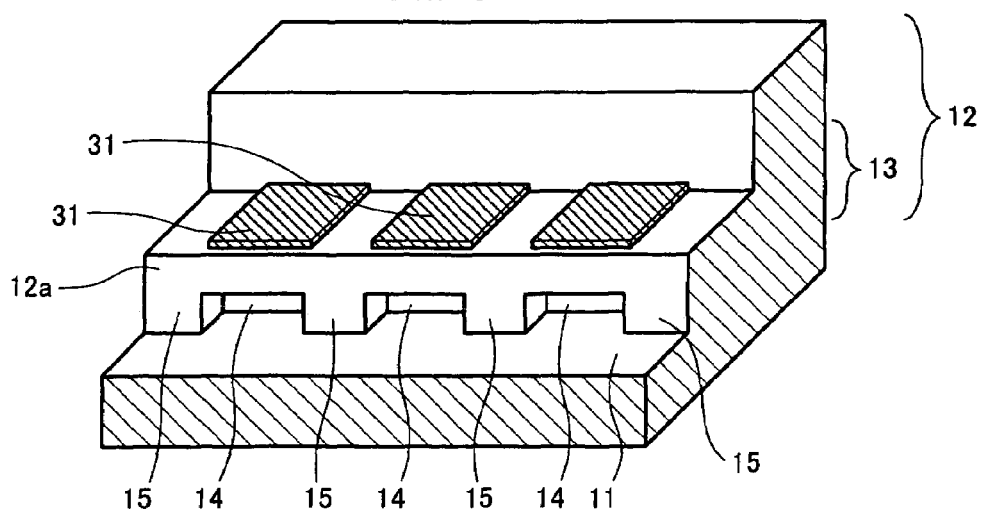
FIG. 3 is a partially enlarged perspective view of the package for a solid image pickup element in FIG. 1.

In FIG. 1 to FIG. 3, a package for a solid image pickup element 1 (hereinafter simply referred to as "package 1") is formed of a base 11 and a sidewall 12 which rises in the periphery thereof and forms a concave space. The sidewall 12 has a stepped shape with lower parts of a pair of mutually facing surfaces protruding inward, a plurality of internal terminals 31 are arranged on a top face of the step (middle stage) 13 and external terminals 32 electrically connected to the respective internal terminals 31 are arranged on the outer surface of the side wall 12.

For this package 1, a solid image pickup element 51 is fixed to the base 11 by means of an adhesive 52, a plurality of terminals of the solid image pickup element 51 are connected to the internal terminals 31 by means of bonding wires 53 respectively and drawn out to external terminals 32 and a transparent member (see FIG. 10) such as a glass plate (not shown) is mounted, thus making up a solid image pickup device.

Figure 10:
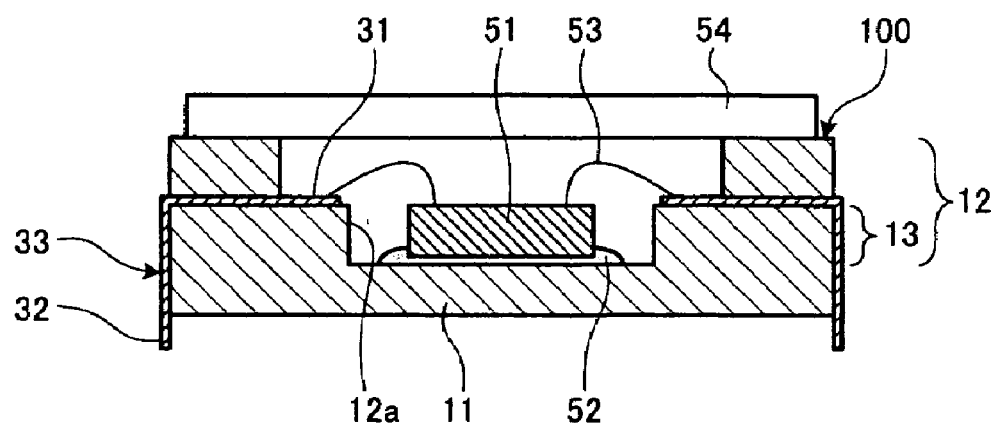
FIG. 10 is a cross-sectional view of a conventional solid image pickup device.
Figure 11:
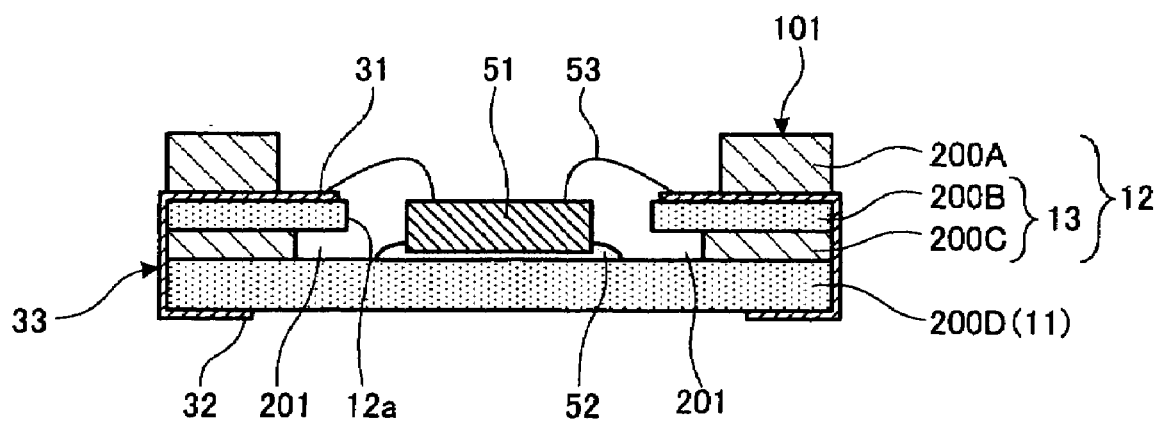
FIG. 11 is a cross-sectional view of another conventional solid image pickup device.

Here, the package 1 differs from the conventional one explained using FIG. 10 or FIG. 11 in that a plurality of recesses 14 for preventing bleeding from the adhesive 52 which fixes the solid image pickup element 51 from creeping up over the internal terminals 31, that is, recesses 14 which have an opening on the inner peripheral surface are formed at predetermined intervals in a lower part of the step 13. The openings of the recesses 14 are below the internal terminals 31 and in the neighborhood of the top face of the base 11.

Thus, when the adhesive 52 or bleeding thereof is spread around during die bonding of the solid image pickup element 51 it flows into the recesses 14 of the step 13 of the side wall 12 and it is difficult for not only the adhesive 52 but also the bleeding which moves faster to creep up along the side and top face in the recesses 14 and inner surface 12a of the side wall 12 (including the step 13), and it is thereby possible to prevent the adhesive 52 and bleeding from adhering to the internal terminals 31. The strength during wire bonding which may be worried due to the presence of the recesses 14 can be secured by residual parts 15 which remain between the recesses 14 at predetermined intervals.

Therefore, even when the clearance between the side of the solid image pickup element 51 and the inner surface 12a of the side wall 12 of the package 1 is minimized to reduce the overall size of the package, it is possible to prevent the adhesive 52 and bleeding thereof from adhering to the internal terminals 31 during die bonding and further secure the strength to withstand the load during wire bonding for the step 13 and the internal terminals 31 thereon. Thus, it is possible to prevent defective wire bonding due to deformation and damage of attachment and the internal terminals 31.

The surface roughness of a bottom face 14a of the recess 14 is preferably greater than the surface roughness of the other surfaces (side and top face in the recess 14). This improves the progress rate of bleeding into the recesses 14 and reliably prevents bleeding from creeping up over the internal terminals 31.

This Embodiment 1 has illustrated the internal terminals 31 and external terminals 32 as the inner leads, outer leads of the lead section 33, but the present invention is not limited to this. For example, it is possible to arrange conductors to be connected to the internal terminals 31 in the thickness direction of the base 11 and arrange the external terminals 32 on the bottom face of the base 11 so as to be connected to the conductors. Furthermore, the embodiment has illustrated the package 1 as molded of plastics (resin) or the like as one piece and the recess 14 as a rectangular parallelepiped space having an opening of substantially the same width as that of the internal terminal 31, but the present invention is not limited to this. The width, height and depth or the like of the recess 14 can be determined so as to meet various conditions such as the clearance between the side of the solid image pickup element 51 and inner surface 12a of the side wall 12 of the package 1, viscosity and components of the adhesive 52 while taking the dimensions necessary for the residual parts 15 for securing the strength into consideration and the recess 14 can have a channel-shaped or semicircular cross section or the like. A shape of the recesses 14 internally communicating with each other is also possible.

Figure 4:
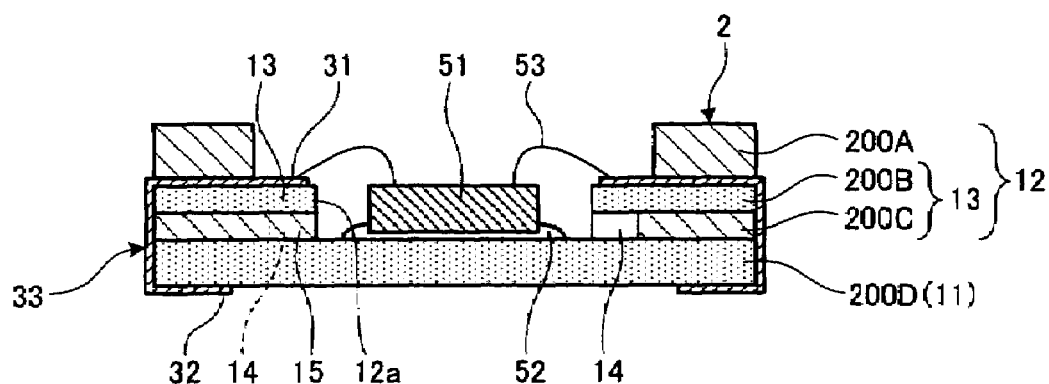
FIG. 4 is a cross-sectional view of a solid image pickup device using a package for a solid image pickup element according to Embodiment 2 of the present invention.
Figure 5:
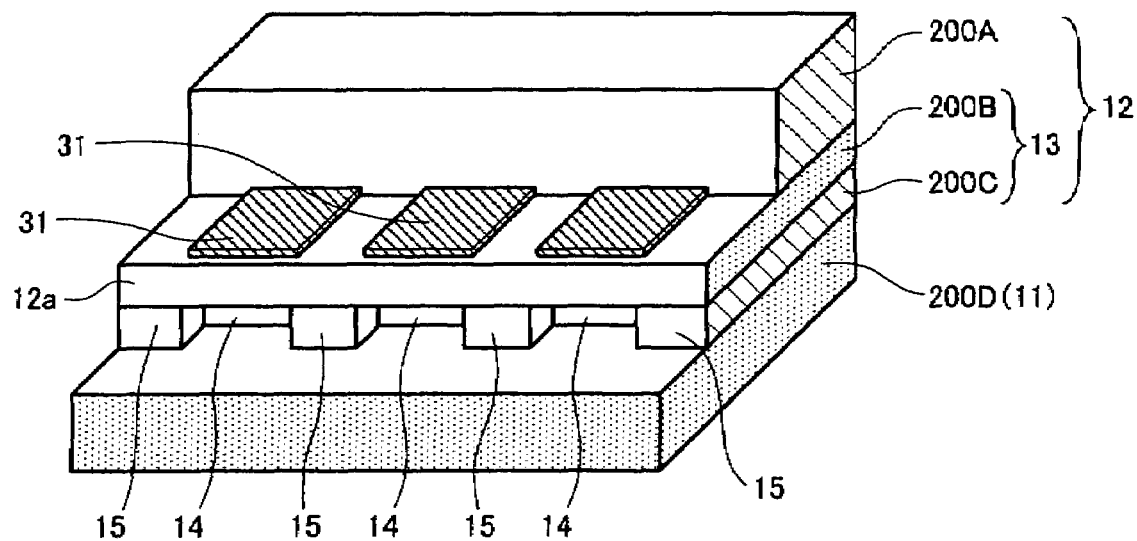
FIG. 5 is a partially enlarged perspective view of the package for a solid image pickup element in FIG. 4.

FIG. 4 and FIG. 5 show the structure of a solid image pickup device using a package according to Embodiment 2 of the present invention. The package 2 of this Embodiment 2 differs from that of Embodiment 1 in that a plurality of ceramic boards are laminated. A side wall 12 is made up of ceramic boards 200A, 200B, 200C and notches which become recesses 14 are formed in the ceramic board 200C of the three boards, a lower layer making up a step 13. A cutting die can be used to notch the ceramic board 200C, which facilitates working. For this reason, this package can be manufactured at lower cost than the package 1 of Embodiment 1.

Figure 6:
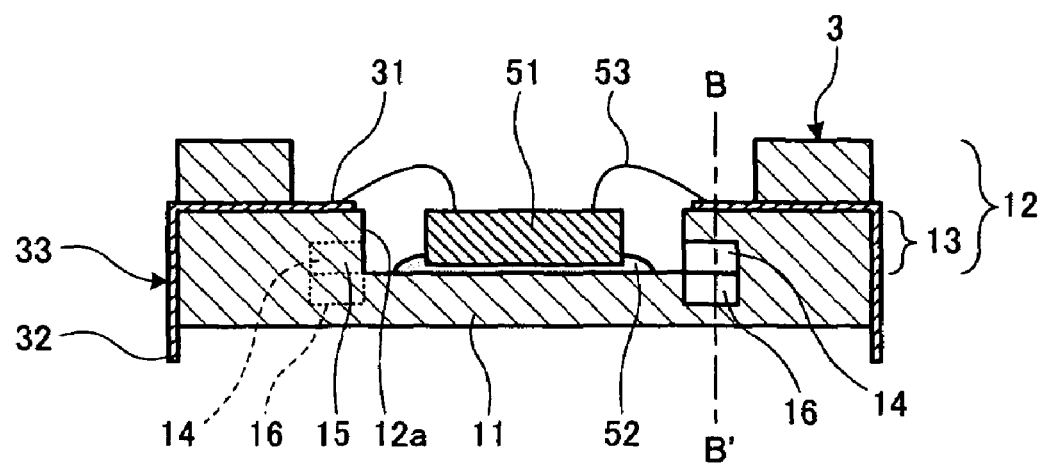
FIG. 6 is a cross-sectional view of a solid image pickup device using a package for a solid image pickup element according to Embodiment 3 of the present invention.
Figure 7:
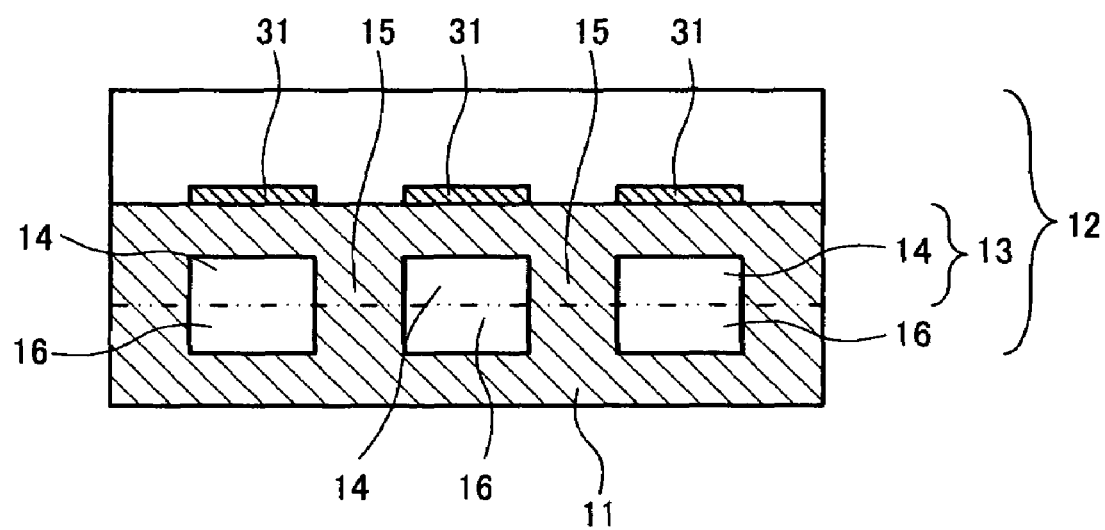
FIG. 7 is a partially enlarged cross-sectional view along a line B-B' of the package for a solid image pickup element in FIG. 6.

FIG. 6 and FIG. 7 show the structure of a solid image pickup device using a package according to Embodiment 3 of the present invention. The package 3 of this Embodiment 3 differs from that of Embodiment 1 in that recesses 16 which are downward dented to be connected to the respective recesses 14 of a step 13 of a side wall 12 are formed in a base 11. Residual parts 15 for securing strength of the step 13 are disposed on flat surfaces between the recesses 16 of the base 11.

In this package 3, the recesses 14 of the step 13 and the recesses 16 of the base 11 form one piece, and therefore the volume of accommodating an adhesive 52 and bleeding thereof is greater than that of Embodiments 1, 2. For this reason, it is possible to more reliably prevent the adhesive 52 and bleeding thereof from creeping up over internal terminals 31.

Figure 8:
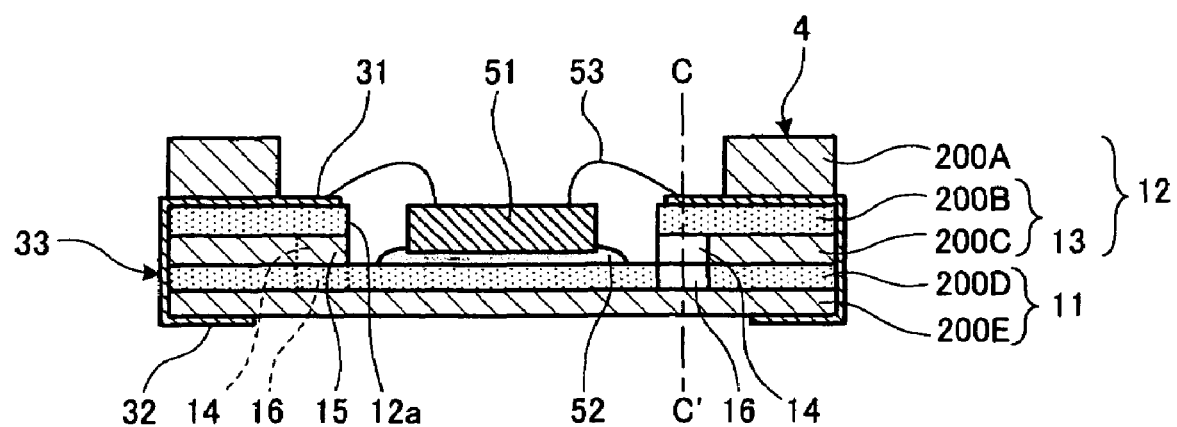
FIG. 8 is a cross-sectional view of a solid image pickup device using a package for a solid image pickup element according to Embodiment 4 of the present invention.
Figure 9:
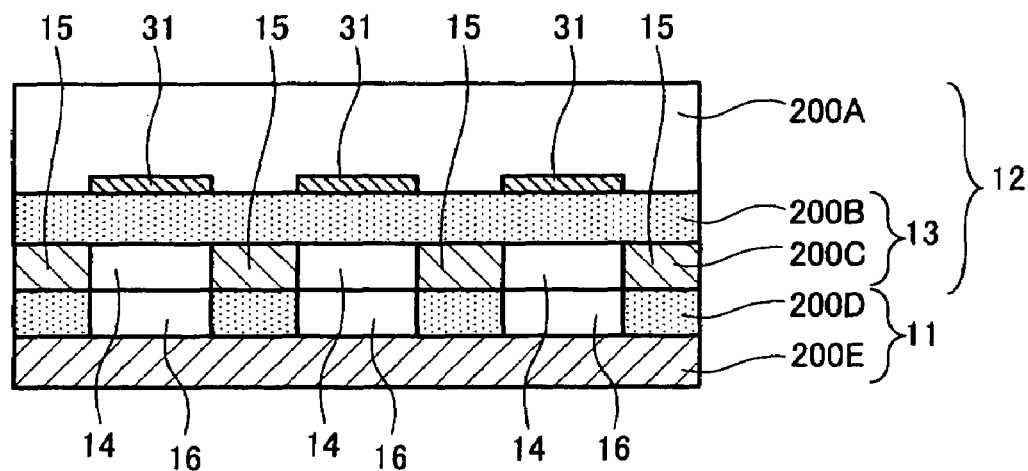
FIG. 9 is a partially enlarged cross-sectional view along a line C-C' of the package for a solid image pickup element in FIG. 8.

FIG. 8 and FIG. 9 show the structure of a solid image pickup device using a package according to Embodiment 4 of the present invention. The package 4 of this Embodiment 4 differs from that of Embodiment 3 in that the package is formed by laminating a plurality of ceramic boards. A side wall 12 is made up of ceramic boards 200A, 200B, 200C and notches which become recesses 14 are formed in the ceramic board 200C of the three boards, a lower layer making up a step 13. A base 11 is made up of ceramic boards 200D, 200E and through holes which become recesses 16 are formed in the ceramic board 200D of the three boards, an upper layer.

In the package 3 of this Embodiment 4, the recess 14 of the step 13 and the recess 16 of the base 11 form one piece, and therefore the volume for accommodating the adhesive and bleeding thereof increases compared to that in Embodiments 1, 2. For this reason, it is possible to more reliably prevent the adhesive 52 and bleeding thereof from creeping up over the internal terminals 31. In addition, a cutting die can be used to notch or perforate the ceramic boards 200C, 200D, which facilitates working. For this reason, the package can be manufactured at lower cost than that of the package 3 of Embodiment 3.

As described above, the package for a solid image pickup element of the present invention can prevent the adhesive and bleeding thereof from adhering to the internal terminals during die bonding or prevent deformation or damage of the internal terminals due to load during wire bonding and prevent defective wire bonding caused by this. Therefore, the package for a solid image pickup element and the solid image pickup device using the same of the present invention are particularly useful for manufacturing a digital still camera, digital video camera, cellular phone with a built-in camera or the like, which is required to be downsized.

What is claimed is:

1. A package for a solid image pickup element, comprising:
    a base;
    a side wall along a periphery of the base thereby forming a recessed space in the center of the side wall; and
    a step protruding inward along a lower part of the side wall,
    internal terminals arranged on a top surface of the step for electrically connecting to terminals of a solid image pickup element fixable to the base,
    wherein the step has a plurality of recesses located at certain intervals in an inner periphery of the step adjacent to the recessed space, and
    the step comprises residual parts separating the plurality of recesses.

2. The package for a solid image pickup element according to claim 1, wherein the base has a plurality of recesses adjacent to the respective plurality of recesses of the step.

3. The package for a solid image pickup element according to claim 1, wherein a surface of the base defining a bottom of the plurality of recesses has a roughness greater than a roughness of surfaces of the step defining the remaining surfaces of the plurality of recesses.

4. The package for a solid image pickup element according to claim 1, wherein the base and the side wall comprise laminated ceramic boards.

5. The package for a solid image pickup element according to claim 1, wherein the base and the side wall are made of resin.

6. A solid image pickup device including the package for a solid image pickup element according to claim 1, wherein a solid image pickup element is fixed and wire-bonded to the package.

7. The package for a solid image pickup element according to claim 1, wherein the plurality of recesses are located below the internal terminals.

8. The package for a solid image pickup element according to claim 1, wherein the plurality of recesses are adjacent to a top surface of the base.

* * * * *

UNITED STATES PATENT AND TRADEMARK OFFICE
CERTIFICATE OF CORRECTION

PATENT NO. : 7,646,428 B2 Page 1 of 1
APPLICATION NO. : 11/523588
DATED : January 12, 2010
INVENTOR(S) : Yoshiki Takayama It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 535 days.

Signed and Sealed this

Sixteenth Day of November, 2010

David J. Kappos
*Director of the United States Patent and Trademark Office*